United States Patent
Hwang

(10) Patent No.: US 8,040,747 B2
(45) Date of Patent: Oct. 18, 2011

(54) CIRCUIT AND METHOD FOR CONTROLLING PRECHARGE IN SEMICONDUCTOR MEMORY APPARATUS

(75) Inventor: Jeong Tae Hwang, Ichon-si (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 106 days.

(21) Appl. No.: 12/650,536

(22) Filed: Dec. 30, 2009

(65) Prior Publication Data
US 2011/0158020 A1 Jun. 30, 2011

(51) Int. Cl.
*G11C 7/00* (2006.01)

(52) U.S. Cl. ............... 365/203; 365/230.06; 365/233.1

(58) Field of Classification Search .............. 365/203, 365/230.06, 230.01, 233.1, 233.12
See application file for complete search history.

(56) References Cited

U.S. PATENT DOCUMENTS

| | | | |
|---|---|---|---|
| 5,748,560 A * | 5/1998 | Sawada | 365/230.03 |
| 5,828,612 A | 10/1998 | Yu et al. | |
| 6,337,832 B1 * | 1/2002 | Ooishi et al. | 365/233.12 |
| 6,343,040 B2 | 1/2002 | Bae | |
| 7,057,950 B2 | 6/2006 | Lee | |
| 7,057,951 B2 | 6/2006 | Im et al. | |
| 7,355,912 B2 | 4/2008 | Park et al. | |
| 7,609,584 B2 | 10/2009 | Kim et al. | |
| 2008/0205175 A1 | 8/2008 | Park et al. | |

FOREIGN PATENT DOCUMENTS

| | | |
|---|---|---|
| JP | 10-302475 | 11/1998 |
| JP | 2007-141439 | 6/2007 |

* cited by examiner

*Primary Examiner* — Gene N Auduong
(74) *Attorney, Agent, or Firm* — William Park & Associates Ltd.

(57) ABSTRACT

A circuit for controlling precharge in a semiconductor memory apparatus includes a read clock driver configured to drive an internal clock signal and generate a read burst clock signal; a read precharge control unit configured to generate a read auto precharge signal in response to the read burst clock signal, a burst end signal, and a read write mode signal; a write clock driver configured to drive the internal clock signal and generate a write burst clock signal in response to the read write mode signal and a data input off signal; a write precharge control unit configured to generate a write auto precharge signal in response to the write burst clock signal, the burst end signal, a write latency signal, and a write address combination signal; and a precharge signal generation unit configured to combine the read and write auto precharge signals and generate an auto precharge signal.

33 Claims, 3 Drawing Sheets

CIRCUIT AND METHOD FOR CONTROLLING PRECHARGE IN SEMICONDUCTOR MEMORY APPARATUS

BACKGROUND OF THE INVENTION

1. Technical Field

Various aspects of the present disclosure generally relate to a semiconductor memory apparatus, and more particularly, to a circuit and a method for controlling precharge in a semiconductor memory apparatus.

2. Related Art

A semiconductor memory apparatus typically receives an external command and performs active and precharge operations. The semiconductor memory apparatus performs a read operation or a write operation in the active operation. In the read operation, data is outputted from memory cells, and in the write operation, data is inputted to memory cells. When one active operation is completed, charges remain in bit lines and data input/output lines on which data input and output operations have been performed. Only when these signal lines are precharged to a preset level, the next active operation can be properly performed. Therefore, the semiconductor memory apparatus has a precharge control circuit which precharges the respective signal lines between active intervals.

In a semiconductor memory apparatus, one precharge control circuit may be provided for each memory bank and is configured to generate auto precharge signals in precharge operations for read operations (hereafter referred to as "read precharge operation") and in precharge operations for write operations (hereafter referred to as "write precharge operation"). To achieve this, the precharge control circuit may have a read precharge control unit and a write precharge control unit. The precharge control circuit generates a burst clock signal using an internal clock signal and generates a read auto precharge signal through the read precharge control unit by using the burst clock signal and burst length information in a read operation. The precharge control circuit generates a write auto precharge signal through the write precharge control unit by using the burst clock signal, the burst length information, and write latency information in a write operation. The precharge control circuit may combine the read auto precharge signal, the write auto precharge signal, and bank information to generate an auto precharge signal, and transmits the generated auto precharge signal to a corresponding memory bank.

FIG. 1 shows waveforms of a read write mode signal rdwt which distinguishes a read operation and a write operation, a data input off signal dioff which indicates an interval during which data is not inputted, and a burst clock signal bclk. The read write mode signal rdwt indicates a read operation mode at a low level and a write operation mode at a high level. The data input off signal dioff is enabled to a high level during an interval in which data is not inputted to the memory bank, that is, in an all bank idle mode or a refresh mode. The burst clock signal bclk is a clock signal that is inputted to the read precharge control unit and the write precharge control unit.

During an interval in which the read write mode signal rdwt has a low level, that is, in the read operation mode, the write precharge control unit need not be activated. Also, the write precharge control unit need not be activated during an interval in which the data input off signal dioff is enabled since a data input operation is not actually performed during that time. As shown in the drawing, however, the burst clock signal bclk is implemented to constantly toggle and such constant toggling configuration makes the activated burst clock signal bclk resulting from such constant toggling implementation makes the write precharge control unit be activated as well.

In this way, the precharge control circuit of a related art semiconductor memory apparatus is configured such that the write precharge control unit is activated even under situations where a write operation mode is not performed, thereby increasing power consumption. In addition, since precharge control circuits are provided in a number corresponding to the number of memory banks, the increased power consumption lowers power utilization efficiency of the entire semiconductor memory apparatus. In order to reduce power consumption in a semiconductor memory apparatus, it is necessary to reduce meaningless current flow in the precharge control circuit. For this reason, a novel technical solution for reducing power consumption is needed in the art.

SUMMARY

Accordingly, there is a need for an improved circuit and method for controlling precharge in semiconductor apparatus that may overcome one or more of the problems discussed above. Therefore, various aspects of the present invention may provide a circuit and a method for controlling precharge in a semiconductor memory apparatus which can reduce power consumption.

To attain the advantages and in accordance with the purposes of the invention, as embodied and broadly described herein, one exemplary aspect of the invention may provide a circuit for controlling precharge in a semiconductor memory apparatus comprising: a read clock driver configured to drive an internal clock signal and generate a read burst clock signal; a read precharge control unit configured to generate a read auto precharge signal in response to the read burst clock signal, a burst end signal, and a read write mode signal wherein the read write mode signal has different potential levels in a read operation mode and a write operation mode; a write clock driver configured to drive the internal clock signal and generate a write burst clock signal in response to the read write mode signal and a data input off signal; a write precharge control unit configured to generate a write auto precharge signal in response to the write burst clock signal, the burst end signal, a write latency signal, and a write address combination signal; and a precharge signal generation unit configured to combine the read auto precharge signal and the write auto precharge signal in response to a bank active signal, a command pulse signal, and a precharge delay signal and generate an auto precharge signal, wherein the write clock driver is configured to toggle the write burst clock signal when the read write mode signal indicates a write operation mode and the data input off signal is disabled.

In another aspect, a circuit for controlling precharge in a semiconductor memory apparatus may comprise a read clock driver configured to drive an internal clock signal and generate a read burst clock signal; a write clock driver configured to drive the internal clock signal and generate a write burst clock signal in response to a read write mode signal and a data input off signal; and a precharge control unit configured to generate an auto precharge signal by using the read burst clock signal in a read operation and the write burst clock signal in a write operation, wherein the write clock driver is configured to toggle the write burst clock signal when the read write mode signal indicates a write operation mode and the data input off signal is disabled.

In another aspect of the present invention, a method for controlling precharge in a semiconductor memory apparatus may comprise: a) generating a read burst clock signal by driving an internal clock signal; b) generating an auto precharge signal in a read operation by using the read burst clock signal, a bank active signal, and a burst end signal that is enabled in the form of a pulse when a time corresponding to a preset burst length passes during data input and output operations of the semiconductor memory apparatus; c) generating a write burst clock signal by driving the internal clock signal in a write operation; and d) generating the auto precharge signal using the write burst clock signal, the burst end signal, and the bank active signal, wherein the step c) is a step of toggling the write burst clock signal when a data input off signal is disabled in a write operation.

In another aspect of the present invention, a circuit for controlling precharge in a semiconductor memory apparatus may comprise a read clock driver configured to drive an internal clock signal and generate a read burst clock signal; a write clock driver configured to provide the internal clock signal as a write burst clock signal in response to a read write mode signal and a data input off signal and inactivate the write burst clock signal when the data input off signal is enabled; a read precharge control unit configured to provide a read auto precharge signal in response to the read write mode signal and the read burst clock signal; and a write precharge control unit configured to provide a write auto precharge signal in response to the read write mode signal and the write burst clock signal, wherein the write precharge control unit is inactivated in response to the inactivated write burst clock signal.

In another aspect of the present invention, a circuit for controlling precharge in a semiconductor memory apparatus may comprise a read clock driver configured to drive an internal clock signal and generate a read burst clock signal; a write clock driver configured to drive the internal clock signal and generate a write burst clock signal in response to a read write mode signal and a data input off signal, and inactivate the write burst clock signal when the data input off signal is enabled; and a precharge control unit configured to generate an auto precharge signal by using the read burst clock signal in a read operation and the write burst clock signal in a write operation.

In another aspect of the present invention, a method for controlling precharge in a semiconductor memory apparatus may comprise: a) generating a read burst clock signal by driving an internal clock signal; b) generating an auto precharge signal in a read operation by using the read burst clock signal, a bank active signal, and a burst end signal that is enabled in the form of a pulse when a time corresponding to a preset burst length passes during data input and output operations of the semiconductor memory apparatus; c) determining whether to provide the internal clock signal as a write burst clock signal that toggles in response to a data input off signal in a write operation; and d) generating the auto precharge signal using the write burst clock signal, the burst end signal, and the bank active signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various aspects consistent with the invention and, together with the description, serve to explain the principles of the invention.

DETAILED DESCRIPTION

Figure 1:
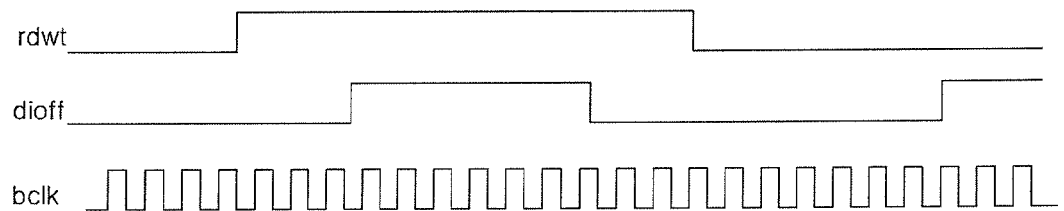
FIG. 1 is a timing diagram explaining an operation of a conventional circuit for controlling precharge in a semiconductor memory apparatus.

Reference will now be made in detail to the exemplary embodiment consistent with the present disclosure, examples of which are illustrated in the accompanying drawings. Wherever possible, the same reference characters will be used throughout the drawings to refer to the same or like parts.

Figure 2:
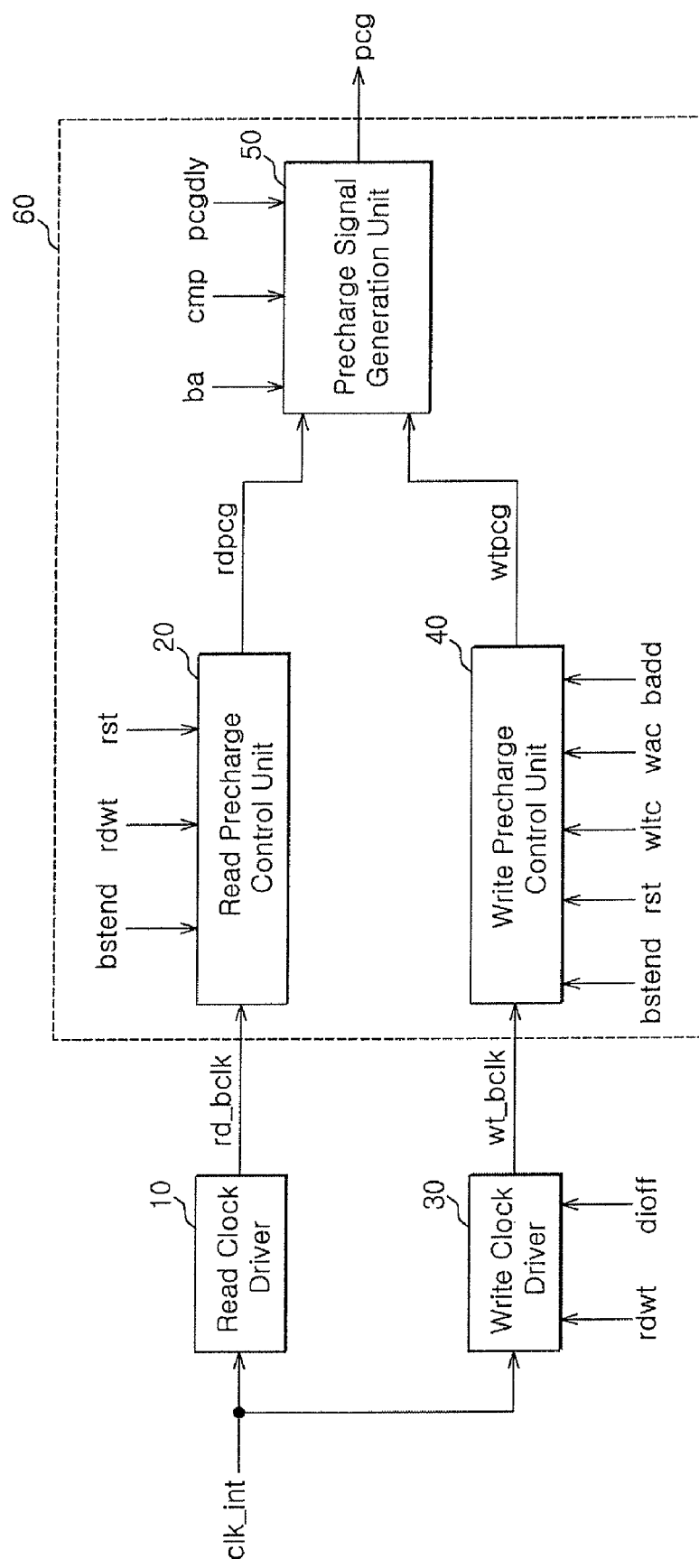
FIG. 2 is a block diagram illustrating a configuration of a circuit for controlling precharge in a semiconductor memory apparatus in accordance with an embodiment of the present invention.

FIG. 2 is a block diagram illustrating a configuration of a circuit for controlling precharge in a semiconductor memory apparatus in accordance with an embodiment of the present invention.

Referring to FIG. 2, a precharge control circuit in accordance with an embodiment of the present invention includes a read clock driver 10 configured to drive an internal clock signal clk_int to generate a read burst clock signal rd_bclk; a read precharge control unit 20 configured to generate a read auto precharge signal rdpcg in response to the read burst clock signal rd_bclk, a burst end signal bstend, a read write mode signal rdwt, and a reset signal rst; a write clock driver 30 configured to drive the internal clock signal clk_int to generate a write burst clock signal wt_bclk in response to the read write mode signal rdwt and a data input off signal dioff; a write precharge control unit 40 configured to generate a write auto precharge signal wtpcg in response to the write burst clock signal wt_bclk, the burst end signal bstend, the reset signal rst, a write latency signal wltc, a write address combination signal wac, and a bank address signal badd; and a precharge signal generation unit 50 configured to combine the read auto precharge signal rdpcg and the write auto precharge signal wtpcg to generate an auto precharge signal pcg in response to a bank active signal ba, a command pulse signal cmp, and a precharge delay signal pcgdly.

The internal clock signal clk_int is inputted through a buffer from the outside of a semiconductor memory apparatus and is used in various parts of the semiconductor memory apparatus. The internal clock signal clk_int is driven by the read clock driver 10 and the write clock driver 30 to respectively generate the read burst clock signal rd_bclk and the write burst clock signal wt_bclk. The read clock driver 10 has a configuration that can be easily implemented in the form of a typical clock driver.

The burst end signal bstend is used to apply a preset burst length to the precharge control circuit in data input and output operations of the semiconductor memory apparatus. When a time corresponding to the preset burst length passes, the burst end signal bstend is enabled in the form of a pulse. When the reset signal rst is enabled in the form of a pulse, the read precharge control unit 20 initializes the state of the read auto precharge signal rdpcg. Thereafter, when the read write mode signal rdwt indicates a read operation mode, the burst end signal bstend is delayed by a preset time in response to the read burst clock signal rd_bclk and is outputted as the read auto precharge signal rdpcg.

The write clock driver 30 performs an operation of driving the internal clock signal clk_int to generate a write burst clock signal wt_bclk. The write clock driver 30 is not activated when the read write mode signal rdwt indicates a read operation mode or the data input off signal dioff is enabled. The data input off signal dioff is enabled to a high level during an interval when data is not inputted to a memory bank, that is, in an all bank idle mode or a refresh mode. The write clock driver 30 is activated only when a data input operation is actually performed in a write operation mode, and allows the write burst clock signal wt_bclk to periodically toggle.

The write latency signal wltc allows the write precharge control unit 40 to operate according to a preset write latency. The write latency signal wltc is a combination of a plurality of signals and can be implemented in a manner such that only one signal is enabled depending on the length of the write latency. The write address combination signal wac is generated by combing an address indicating an all bank precharge operation or an auto precharge operation with the read write mode signal rdwt, and is enabled in an all bank precharge mode or an auto precharge mode before a write operation. The bank address signal badd indicates whether a corresponding memory bank is to be activated or not. The write precharge control unit 40 can be activated only when the bank address signal badd is enabled.

The write precharge control unit 40 delays the burst end signal bstend in response to the write burst clock signal wt_bclk after the reset signal rst is enabled and the state of the write auto precharge signal wtpcg is initialized. The write precharge control unit 40 can be implemented in the form of a shift register. The write latency signal wltc determines the number of periods the write burst clock signal wt_bclk is shifted before the burst end signal bstend is outputted as the write auto precharge signal wtpcg.

The write precharge control unit 40 performs an operation of shifting the burst end signal bstend using the write burst clock signal wt_bclk. In a read operation mode, although a write auto precharge signal wtpcg is not enabled, the shifting operation can be continuously performed in the write precharge control unit 40. Thus, when the write precharge control unit 40 performs the shifting operation in a read operation mode or during an interval when data input operations are not actually performed, unnecessary power consumption is caused. However, according to the present invention, since the write clock driver 30 is inactivated during the interval when data input operations are not actually performed and controls the write burst clock signal wt_bclk to not toggle, the write precharge control unit 40 is not activated and unnecessary power consumption of the precharge control circuit can be reduced.

The precharge signal generation unit 50 performs a logical OR operation of the read auto precharge signal rdpcg and the write auto precharge signal wtpcg. The precharge signal generation unit 50 outputs a signal generated through the logical OR operation as the auto precharge signal pcg under the control of the bank active signal ba, a command pulse signal cmp, and a precharge delay signal pcgdly. The bank active signal ba is enabled when the corresponding memory bank is in an active mode or a refresh mode. The command pulse signal cmp indicates a read operation and a write operation of the corresponding memory bank. The precharge delay signal pcgdly delays the generation of the auto precharge signal pcg until a precharge operation is actually performed after a precharge command is inputted and thereby improves the stability of the precharge operation.

The read precharge control unit 20, the write precharge control unit 40, and the precharge signal generation unit 50 can be collectively referred to as a precharge control unit 60. Here, the precharge control unit 60 generates an auto precharge signal pcg by using the read burst clock signal rd_bclk in a read operation and the write burst clock signal wt_bclk in a write operation.

Figure 3:
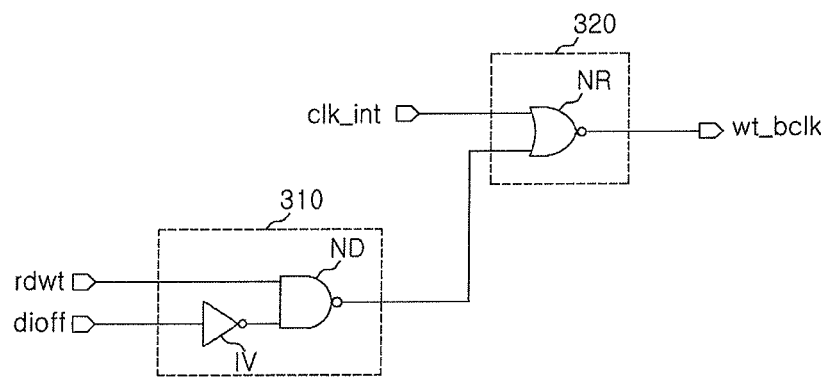
FIG. 3 is a circuit diagram illustrating a detailed configuration of a write clock driver shown in FIG. 2.

FIG. 3 is a circuit diagram illustrating a detailed configuration of the write clock driver shown in FIG. 2.

Referring to FIG. 3, the write clock driver 30 includes a clock enable unit 310 configured to combine the read write mode signal rdwt with the data input off signal dioff to generate a clock enable signal clken; and a clock driving unit 320 configured to drive the internal clock signal clk_int in response to the clock enable signal clken to generate the write burst clock signal wt_bclk.

The clock enable unit 310 includes an inverter IV configured to receive the data input off signal dioff, and a NAND gate ND configured to receive the read write mode signal rdwt and an output signal of the inverter IV and output the clock enable signal clken.

The clock driving unit 320 includes a NOR gate NR configured to receive the internal clock signal clk_int and the clock enable signal clken to output the write burst clock signal wt_bclk.

In the write clock driver 30 configured in this way, the clock enable signal clken is implemented as a low enable signal.

When the read write mode signal rdwt indicates a read operation mode at a low level, the clock enable unit 310 disables the clock enable signal clken to a high level. Also, when the data input off signal dioff is enabled to a high level, the clock enable unit 310 disables the clock enable signal clken. In these cases, the clock driving unit 320 disables the write burst clock signal wt_bclk irrespective of the input of the internal clock signal clk_int.

Conversely, when the read write mode signal rdwt indicates a write mode operation at a high level and the data input off signal dioff is disabled to a low level, the clock enable unit 310 enables the clock enable signal clken. In this case, the write burst clock signal wt_bclk outputted from the clock driving unit 320 has a form in which the internal clock signal clk_int is inverted and delayed.

Figure 4:
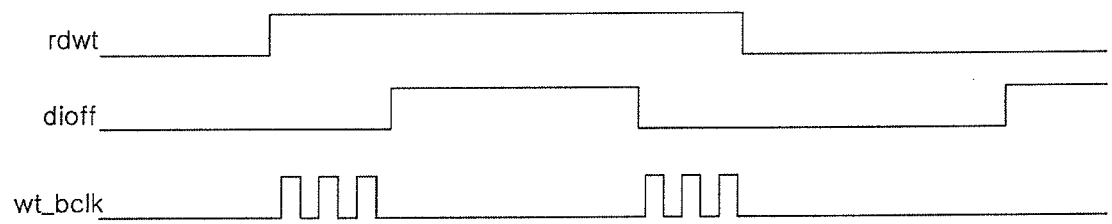
FIG. 4 is a timing diagram explaining an operation of a circuit for controlling precharge in a semiconductor memory apparatus in accordance with the embodiment of the present invention.

FIG. 4 is a timing diagram explaining an operation of the circuit for controlling precharge in a semiconductor memory apparatus in accordance with the embodiment of the present invention.

FIG. 4 shows waveforms of the read write mode signal rdwt, the data input off signal dioff, and the write burst clock signal wt_bclk.

As can be readily seen from the drawing, in a write operation that is, in cases where the read write burst clock signal wt_bclk is a high level, the write burst clock signal wt_bclk toggles. However, when the data input off signal dioff is enabled, the write burst clock signal wt_bclk is disabled to a low level.

In a read operation, that is, in cases where the read write mode signal rdwt is a low level, the write burst clock signal wt_bclk is disabled irrespective of the state of the data input off signal dioff.

The write burst clock signal wt_bclk is activated only when data input operation is actually performed. When comparing the waveform of the write burst clock signal wt_bclk with that shown in FIG. 1 illustrating the related art, the effect of power consumption reduction according to the present invention can be readily appreciated.

As is apparent from the above description, in a circuit and method for controlling precharge in a semiconductor memory apparatus according to the present invention, a write burst clock signal is disabled during an interval when a data input operation is not actually performed, and thus a write precharge control unit is inactivated and unnecessary power consumption is reduced. Considering that a write clock driver and the write precharge control unit are each provided correspondingly to the number of memory banks, the power consumption of the semiconductor memory apparatus can be significantly reduced because the write burst clock signal is disabled at certain intervals.

Throughout the description, including in the claims, the term "comprising a" should be understood as being synonymous with the term "comprising at least one" unless otherwise specified to the contrary.

While certain embodiment has been described above, it will be understood to those skilled in the art that the embodiment described is by way of example only. Accordingly, the circuit and method described herein should not be limited based on the described embodiment. Rather, the circuit and the method described herein should only be limited in light of the claims that follow when taken in conjunction with the above description and accompanying drawings.

What is claimed is:

1. A circuit for controlling precharge in a semiconductor memory apparatus, comprising:
    a read clock driver configured to drive an internal clock signal and generate a read burst clock signal;
    a read precharge control unit configured to generate a read auto precharge signal in response to the read burst clock signal, a burst end signal, and a read write mode signal wherein the read write mode signal has different potential levels in a read operation mode and a write operation mode;
    a write clock driver configured to drive the internal clock signal and generate a write burst clock signal in response to the read write mode signal and a data input off signal;
    a write precharge control unit configured to generate a write auto precharge signal in response to the write burst clock signal, the burst end signal, a write latency signal, and a write address combination signal; and
    a precharge signal generation unit configured to combine the read auto precharge signal and the write auto precharge signal and generate an auto precharge signal in response to a bank active signal, a command pulse signal, and a precharge delay signal,
    wherein the write clock driver is configured to toggle the write burst clock signal when the read write mode signal indicates the write operation mode and the data input off signal is disabled.

2. The circuit according to claim 1, wherein the internal clock signal is inputted through a buffer from outside of the semiconductor memory apparatus.

3. The circuit according to claim 1, wherein the burst end signal is enabled in the form of a pulse when a time corresponding to a preset burst length passes in data input and output operations of the semiconductor memory apparatus.

4. The circuit according to claim 3, wherein the read precharge control unit is configured to delay the burst end signal by a preset time in response to the read burst clock signal when the read write mode signal indicates a read operation mode, and output the delayed burst end signal as the read auto precharge signal.

5. The circuit according to claim 1, wherein the write clock driver comprises:
    a clock enable unit configured to combine the read write mode signal and the data input off signal and generate a clock enable signal; and
    a clock driving unit configured to drive the internal clock signal and generate the write burst clock signal in response to the clock enable signal.

6. The circuit according to claim 3, wherein the write latency signal comprises a combination of a plurality of signals and is implemented in a manner such that only one signal is enabled depending on the length of the write latency.

7. The circuit according to claim 5, wherein the write precharge control unit is configured to shift the burst end signal by a time indicated by the write latency signal in response to the write burst clock signal, and output the shifted burst end signal as the write auto precharge signal.

8. The circuit according to claim 1, wherein the bank active signal is enabled when a corresponding memory bank is in an active mode or a refresh mode, the command pulse signal indicates a read operation and a write operation of the corresponding memory bank, and the precharge delay signal delays generation of the auto precharge signal after a precharge command is inputted.

9. The circuit according to claim 8, wherein the precharge signal generation unit is configured to perform a logical OR operation of the read auto precharge signal and the write auto precharge signal and output a signal generated through the logical OR operation as the auto precharge signal under the control of the bank active signal the command pulse signal, and the precharge delay signal.

10. A circuit for controlling precharge in a semiconductor memory apparatus, comprising:
    a read clock driver configured to drive an internal clock signal and generate a read burst clock signal;
    a write clock driver configured to drive the internal clock signal and generate a write burst clock signal in response to a read write mode signal and a data input off signal; and
    a precharge control unit configured to generate an auto precharge signal by using the read burst clock signal in a read operation and the write burst clock signal in a write operation,
    wherein the write clock driver is configured to toggle the write burst clock signal when the read write mode signal indicates a write operation mode and the data input off signal is disabled.

11. The circuit according to claim 10, wherein the precharge control unit comprises:
    a read precharge control unit configured to generate a read auto precharge signal in response to the read burst clock signal, a burst end signal, and the read write mode signal;
    a write precharge control unit configured to generate a write auto precharge signal in response to the write burst clock signal, the burst end signal, a write latency signal, and a write address combination signal; and
    a precharge signal generation unit configured to combine the read auto precharge signal and the write auto precharge signal and generate the auto precharge signal in response to the a bank active signal, a command pulse signal, and a precharge delay signal.

12. The circuit according to claim 11, wherein the read precharge control unit is configured to delay the burst end signal by a preset time in response to the read burst clock signal when the read write mode signal indicates a read operation mode and output the delayed burst end signal as the read auto precharge signal.

13. The circuit according to claim 11, wherein the write precharge control unit is configured to shift the burst end signal by a time indicated by the write latency signal in response to the write burst clock signal and output the shifted burst end signal as the write auto precharge signal.

14. The circuit according to claim 11, wherein the precharge signal generation unit is configured to perform a logical OR operation of the read auto precharge signal and the write auto precharge signal and output a signal generated through the logical OR operation as the auto precharge signal under the control of the bank active signal, the command pulse signal, and the precharge delay signal.

15. A method for controlling precharge in a semiconductor memory apparatus comprising:
   a) generating a read burst clock signal by driving an internal clock signal;
   b) generating an auto precharge signal in a read operation by using the read burst clock signal, a bank active signal, and a burst end signal that is enabled in the form of a pulse when a time corresponding to a preset burst length passes during data input and output operations of the semiconductor memory apparatus;
   c) generating a write burst clock signal by driving the internal clock signal in a write operation; and
   d) generating the auto precharge signal using the write burst clock signal, the burst end signal, and the bank active signal,
   wherein the step c) is a step of toggling the write burst clock signal when a data input off signal is disabled in a write operation.

16. The method according to claim 15, wherein the internal clock signal is inputted through a buffer from outside of the semiconductor memory apparatus, and the bank active signal is enabled when a corresponding memory bank is in an active mode or a refresh mode.

17. The method according to claim 16, wherein the step b) comprises the steps of:
   delaying the burst end signal by a preset time in response to the read burst clock signal and outputting the delayed burst end signal as a read auto precharge signal; and
   outputting the read auto precharge signal as the auto precharge signal under the control of the bank active signal.

18. The method according to claim 15, wherein the step c) comprises the steps of:
   generating a clock enable signal in response to whether the write operation is performed and the data input off signal; and
   generating the write burst clock signal by driving the internal clock signal in response to the clock enable signal.

19. The method according to claim 16, wherein the step d) comprises the steps of:
   shifting the burst end signal by a time corresponding to write latency in response to the write burst clock signal and outputting the shifted burst end signal as the write auto precharge signal; and
   outputting the write auto precharge signal as the auto precharge signal under the control of the bank active signal.

20. A circuit for controlling precharge in a semiconductor memory apparatus, comprising:
   a read clock driver configured to drive an internal clock signal and generate a read burst clock signal;
   a write clock driver configured to provide the internal clock signal as a write burst clock signal in response to a read write mode signal and a data input off signal and inactivate the write burst clock signal when the data input off signal is enabled;
   a read precharge control unit configured to provide a read auto precharge signal in response to the read write mode signal, and the read burst clock signal; and
   a write precharge control unit configured to provide a write auto precharge signal in response to the read write mode signal and the write burst clock signal,
   wherein the write precharge control unit is inactivated in response to the inactivated write burst clock signal.

21. The circuit according to claim 20, wherein the read precharge control unit is configured to delay a burst end signal by a preset time in response to the read burst clock signal when the read write mode signal indicates a read operation mode and output the delayed burst end signal as the read auto precharge signal.

22. The circuit according to claim 20, wherein the write clock driver is configured to toggle the write burst clock signal when the read write mode signal indicates a write operation mode and the data input off signal is disabled.

23. The circuit according to claim 22, wherein the write clock driver comprises:
   a clock enable unit configured to combine the read write mode signal and the data input off signal and generate a clock enable signal; and
   a clock driving unit configured to drive the internal clock signal in response to the clock enable signal and generate the write burst clock signal.

24. The circuit according to claim 20, wherein the write precharge control unit is configured to shift the burst end signal by a time indicated by a write latency signal in response to the write burst clock signal and output the shifted burst end signal as the write auto precharge signal.

25. A circuit for controlling precharge in a semiconductor memory apparatus, comprising:
   a read clock driver configured to drive an internal clock signal and generate a read burst clock signal;
   a write clock driver configured to drive the internal clock signal in response to a read write mode signal and a data input off signal and generate a write burst clock signal, and inactivate the write burst clock signal when the data input off signal is enabled; and
   precharge control unit configured to generate an auto precharge signal by using the read burst clock signal in a read operation and the write burst clock signal in a write operation.

26. The circuit according to claim 25, wherein the write clock driver is configured to toggle the write burst clock signal when the read write mode signal indicates a write operation mode and the data input off signal is disabled.

27. The circuit according to claim 25, wherein the precharge control unit comprises:
   a read precharge control unit configured to generate a read auto precharge signal in response to the read burst clock signal, a burst end signal, and the read write mode signal;
   a write precharge control unit configured to generate a write auto precharge signal in response to the write burst clock signal, the burst end signal, a write latency signal, and a write address combination signal; and
   a precharge signal generation unit configured to combine the read auto precharge signal and the write auto precharge signal and generate the auto precharge signal in response to the a bank active signal, a command pulse signal, and a precharge delay signal.

28. The circuit according to claim 27, wherein the read precharge control unit is configured to delay the burst end signal by a preset time in response to the read burst clock signal when the read write mode signal indicates a read operation mode, and output the delayed burst end signal as the read auto precharge signal.

29. The circuit according to claim 27, wherein the write precharge control unit is configured to shift the burst end signal by a time indicated by the write latency signal in response to the write burst clock signal and output the shifted burst end signal as the write auto precharge signal.

30. The circuit according to claim 27, wherein the precharge signal generation unit is configured to perform a logical OR operation of the read auto precharge signal and the write auto precharge signal and output a signal generated through the logical OR operation as the auto precharge signal under the control of the bank active signal, the command pulse signal, and the precharge delay signal.

31. A method for controlling precharge in a semiconductor memory apparatus, comprising the steps of:
- a) generating a read burst clock signal by driving an internal clock signal;
- b) generating an auto precharge signal in a read operation by using the read burst clock signal, a bank active signal, and a burst end signal that is enabled in the form of a pulse when a time corresponding to a preset burst length passes during data input and output operations of the semiconductor memory apparatus;
- c) determining whether to provide the internal clock signal as a write burst clock signal that toggles in response to a data input off signal in a write operation; and
- d) generating the auto precharge signal using the write burst clock signal, the burst end signal, and the bank active signal.

32. The method according to claim 31, wherein the step c) inactivates the write burst clock signal when the data input off signal is enabled in the write operation.

33. The method according to claim 32, wherein the step c) comprises the steps of:
- generating a clock enable signal in response to whether the write operation is performed and the data input off signal; and
- generating the write burst clock signal by driving the internal clock signal in response to the clock enable signal.

* * * * *